United States Patent
Zhou

(10) Patent No.: US 12,278,695 B2
(45) Date of Patent: Apr. 15, 2025

(54) METHOD AND APPARATUS FOR ACQUIRING TIMESTAMP OF DATA STREAM, STORAGE MEDIUM, AND ELECTRONIC APPARATUS

(71) Applicant: ZTE CORPORATION, Guangdong (CN)

(72) Inventor: Yan Zhou, Guangdong (CN)

(73) Assignee: SANECHIPS TECHNOLOGY CO., LTD., Shenzhen (CN)

(*) Notice: Subject to any disclaimer, the term of this patent is extended or adjusted under 35 U.S.C. 154(b) by 526 days.

(21) Appl. No.: 17/765,417

(22) PCT Filed: Sep. 28, 2020

(86) PCT No.: PCT/CN2020/118316
§ 371 (c)(1),
(2) Date: Mar. 30, 2022

(87) PCT Pub. No.: WO2021/063303
PCT Pub. Date: Apr. 8, 2021

(65) Prior Publication Data
US 2022/0360350 A1 Nov. 10, 2022

(30) Foreign Application Priority Data
Sep. 30, 2019 (CN) .......... 201910944071.X

(51) Int. Cl.
*H04J 3/06* (2006.01)
*H03M 9/00* (2006.01)
*H04L 7/00* (2006.01)

(52) U.S. Cl.
CPC ............ *H04J 3/0661* (2013.01); *H03M 9/00* (2013.01); *H04L 7/0012* (2013.01)

(58) Field of Classification Search
CPC ........ H04J 3/0661; H04J 3/0697; H04J 3/065; H03M 9/00; H04L 7/0012
(Continued)

(56) References Cited

U.S. PATENT DOCUMENTS

| | | | |
|---|---|---|---|
| 2008/0005310 A1* | 1/2008 | Xu | H04L 12/2838 709/224 |
| 2012/0148248 A1* | 6/2012 | Li | H04J 3/065 398/58 |

(Continued)

FOREIGN PATENT DOCUMENTS

| | | | |
|---|---|---|---|
| CN | 102761396 A | 10/2012 | |
| CN | 103036893 A | 4/2013 | |

(Continued)

OTHER PUBLICATIONS

Sanechips Technology Co., Ltd., International Search Report with English Translation, PCT/CN2020/118316, Nov. 25, 2020, 5 pgs.

(Continued)

*Primary Examiner* — Kwang B Yao
*Assistant Examiner* — Syed M Bokhari
(74) *Attorney, Agent, or Firm* — CANTOR COLBURN LLP

(57) ABSTRACT

The present disclosure provides a method and apparatus for acquiring a timestamp of a data stream, a storage medium and an electronic apparatus. The method for acquiring the timestamp of the data stream includes: receiving a data stream to be transmitted, and acquiring a first frame header identifier of the data stream to be transmitted in a serializer-deserializer (SERDES) clock mode, the first frame header identifier being used for representing a position of a frame header of the data stream to be transmitted; determining, based on the first frame header identifier, a timestamp of the data stream to be transmitted under a system clock; encap- (Continued)

sulating the timestamp to obtain a first target data frame; and outputting the first target data frame.

17 Claims, 3 Drawing Sheets

(58) Field of Classification Search
USPC .......................................................... 370/503
See application file for complete search history.

(56) References Cited

U.S. PATENT DOCUMENTS

| | | | |
|---|---|---|---|
| 2014/0092918 A1* | 4/2014 | Jost | H04J 3/0661 370/465 |
| 2016/0205008 A1 | 7/2016 | Dasu et al. | |
| 2018/0192323 A1* | 7/2018 | Zhang | H04W 28/065 |

FOREIGN PATENT DOCUMENTS

| | | |
|---|---|---|
| CN | 105846941 A | 8/2016 |
| CN | 106911426 A | 6/2017 |
| CN | 107070576 A | 8/2017 |
| CN | 108259106 A | 7/2018 |

OTHER PUBLICATIONS (Non-official translation: Information Consumption Supermarket), "Technical Requirements of Multi-Service bearing for Optical Transport Network (OTN)," (non-official translation: Originality Document, https://max.book118.com/html/2014/0827/9505455.shtm), Sep. 7, 2017, 54 pgs.

* cited by examiner

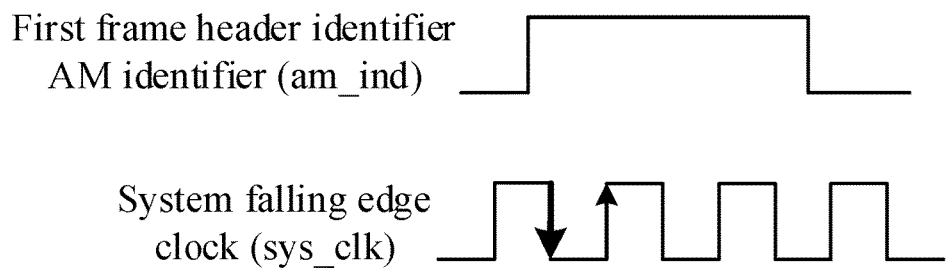
FIG. 4
| Start bit 1 bit | Frame header synchronization byte 1 | Frame header synchronization byte 2 | Timestamp 8 bytes | CRC 1 byte | Stop bit 1 bit |
FIG. 5
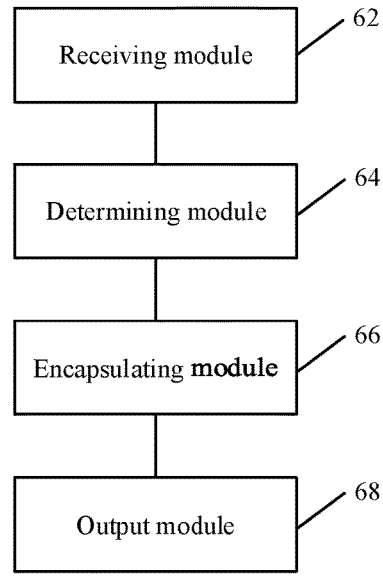
FIG. 6

METHOD AND APPARATUS FOR ACQUIRING TIMESTAMP OF DATA STREAM, STORAGE MEDIUM, AND ELECTRONIC APPARATUS

CROSS REFERENCE TO RELATED APPLICATIONS

The present application is a United States National Stage Application filed under 35 U.S.C. § 371 of PCT Patent Application Serial No. PCT/CN2020/118316, filed on Sep. 28, 2020, which claims priority to Chinese Patent Application No. 201910944071.X filed on Sep. 30, 2019, each of which is incorporated herein by reference in its entirety.

The present application claims priority to Chinese Patent Application No. 201910944071.X filed before the China National Intellectual Property Administration on Sep. 30, 2019, which is incorporated herein by reference in its entirety.

TECHNICAL FIELD

The present disclosure relates to the field of communication technology, and in particular to a method and an apparatus for acquiring a timestamp of a data stream, a storage medium and an electronic apparatus.

BACKGROUND

As network technologies and communication technologies are continuously developing and updated, the high-precision clock synchronization technology is widely applied to distributed control systems, satellite positioning systems and carrier networks. The Institute of Electrical and Electronics Engineers (IEEE) 1588 protocol was originally used to describe precise clock synchronization in network measurement and control systems. With development of the Ethernet technology, the IEEE1588 protocol has been applied to the Ethernet field. A processing based on the IEEE1588 protocol can be performed in 100M Ethernet with high precision. In order to improve stability and reliability of a system, it is worthy of researching to acquire timestamps that are more accurate and stable. A timestamp is a time point for indicating generation of a data block in a data stream. It is certain that a timestamp of a data block collected later is greater than a timestamp of a data block collected earlier. With such a timestamp, a sequence of data blocks can be marked, and synchronization of devices in the distributed control system can be guaranteed.

After a serializer-deserializer (SERDES) module of a device receives a data stream to be transmitted, the device has to adaptively convert the data stream to be transmitted. However, there may be a data gap, i.e., invalid data, after the device converts the data stream to be transmitted. As a result, no precise timestamp can be obtained by sampling of a timestamp on a converted data stream to be transmitted, namely the data stream containing invalid data.

SUMMARY

The present disclosure provides a method and an apparatus for acquiring a timestamp of a data stream, a storage medium and an electronic apparatus, so as to at least address the problem that no precise timestamp of a data stream can be acquired.

The present disclosure provides a method for acquiring a timestamp of a data stream, including:

receiving a data stream to be transmitted, and acquiring a first frame header identifier of the data stream to be transmitted in a serializer-deserializer (SERDES) clock mode, the first frame header identifier being used for representing a position of a frame header of the data stream to be transmitted;

determining, based on the first frame header identifier, a timestamp of the data stream to be transmitted under a system clock;

encapsulating the timestamp to obtain a first target data frame; and outputting the first target data frame.

The present disclosure further provides an apparatus for acquiring a timestamp of a data stream, including:

a receiving module configured to receive a data stream to be transmitted, and acquire a first frame header identifier of the data stream to be transmitted in a serializer-deserializer (SERDES) clock mode, the first frame header identifier being used for representing a position of a frame header of the data stream to be transmitted;

a determining module configured to determine, based on the first frame header identifier, a timestamp of the data stream to be transmitted under a system clock;

an encapsulating module configured to encapsulate the timestamp to obtain a first target data frame; and an outputting module configured to output the first target data frame.

The present disclosure further provides a storage medium storing a computer program configured to perform the method for acquiring the timestamp of the data stream when the computer program is running.

The present disclosure further provides an electronic apparatus including a memory and a processor. The memory stores a computer program. The processor is configured to run the computer program to perform the method for acquiring the timestamp of the data stream.

BRIEF DESCRIPTION OF THE DRAWINGS

FIG. 4 is a schematic diagram for synchronizing a falling edge of a system clock with a first frame header identifier according to an embodiment of the present disclosure;

FIG. 5 is a schematic diagram for a frame format of a first target data frame according to an embodiment of the present disclosure;

FIG. 6 is a schematic diagram for a structure of an apparatus for acquiring a timestamp of a data stream according to an embodiment of the present disclosure.

DETAILED DESCRIPTION OF THE EMBODIMENTS

The present disclosure will be described with reference to drawings and embodiments.

Terms such as "first" and "second" herein are meant to distinguish similar objects rather than to describe a particular sequence.

Embodiment 1

Figure 1:
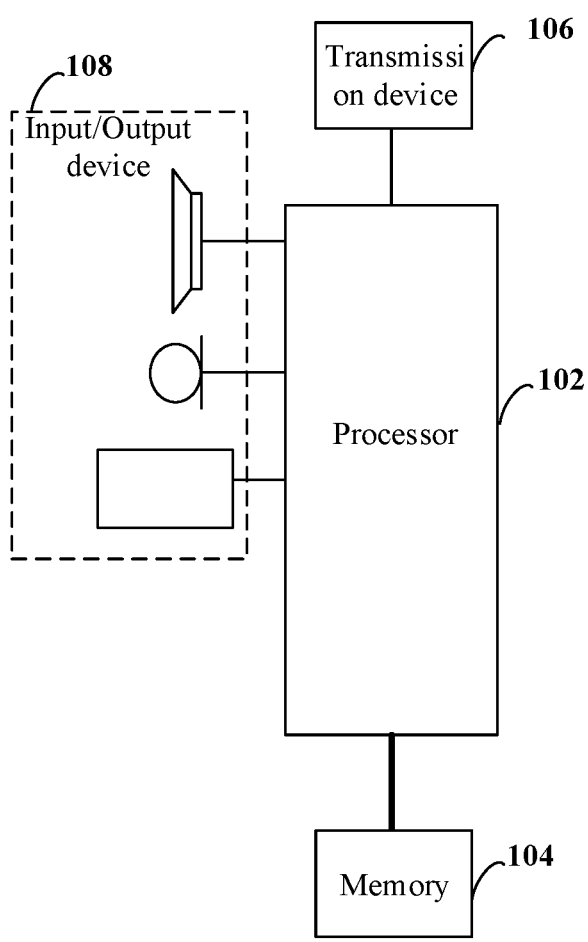
FIG. 1 is a block diagram for a hardware structure of a terminal performing a method for acquiring a timestamp of a data stream according to an embodiment of the present disclosure.

Embodiment 1 of the present disclosure is a method embodiment that may be performed by a computing apparatus such as a terminal, a computer terminal or the like. Herein, a terminal is taken as an example. FIG. 1 is a block diagram for a hardware structure of the terminal performing a method for acquiring a timestamp of a data stream according to this embodiment. As shown in FIG. 1, the terminal may include one or more (only one is shown in FIG. 1) processors 102 (the processors 102 may include but not limited to a processing device, such as a microcontroller unit (MCU). a field programmable gate array (FPGA) or the like) and a memory 104 configured for storing data. Alternatively, the terminal may further include a transmission device 106 configured for communication functions and an input/output device 108. The structure as shown in FIG. 1 is only for illustration rather than to define the structure of the terminal. For example, the terminal may further include more or less components than what is shown in FIG. 1, or has a configuration different from that shown in FIG. 1.

The memory 104 may be configured to store a computer program, such as a module and a software program of an application, for example, a computer program corresponding to the method for acquiring a timestamp of a data stream according to this embodiment. Through running of the computer program stored in the memory 104, the processor 102 performs multiple functional application and data processing to implement the method. The memory 104 may include a high-speed random access memory, and may further include a non-volatile memory such as one or more magnetic storage apparatuses, flash memories, or other non-volatile solid-state memories. In some examples, the memory 104 may include a memory remotely disposed relative to the processor 102. Remote memories may be connected to the terminal through a network. Examples of the network may include but not limited to the Internet, an enterprise intranet, a local area network, a mobile communication network and a combination thereof.

The transmission device 106 is configured to receive or transmit data through a network. A particular example of the network may include a wireless network provided by a communication provider of a terminal. In one example, the transmission device 106 includes a network interface controller (NIC) that may be connected to other network devices through a base station and thus can communicate with the Internet. In one example, the transmission device 106 may be a radio frequency (RF) module configured to wirelessly communicate with the Internet.

In this embodiment, a method for acquiring a timestamp of a data stream is provided. The method is performed by the above-mentioned terminal. The method may be applied to a chip provided with a serializer-deserializer (SERDES) interface. The chip at least has a function of stamping a timestamp on a data stream to be transmitted. Through the method, a 1588 function, i.e., a function of performing frequency synchronization and phase synchronization between devices, may be obtained in a flexible optical transport network (FLEXO) protocol.

In this embodiment, the method for acquiring a timestamp of a data stream may be applied to the following scenario: the timestamp of the data stream is acquired when the data stream to be transmitted enters the chip, i.e., at an input end of the chip, and when the data stream to be transmitted is output from the chip, i.e., at an output end of the chip. The input end and the output end of the chip corresponds to SERDES interfaces of the chip. In this embodiment, the timestamp may be sampled at the SERDES to avoid passing through the memory or a cache, and thus avoid a jitter of the timestamp caused by gap conversion.

Figure 2:
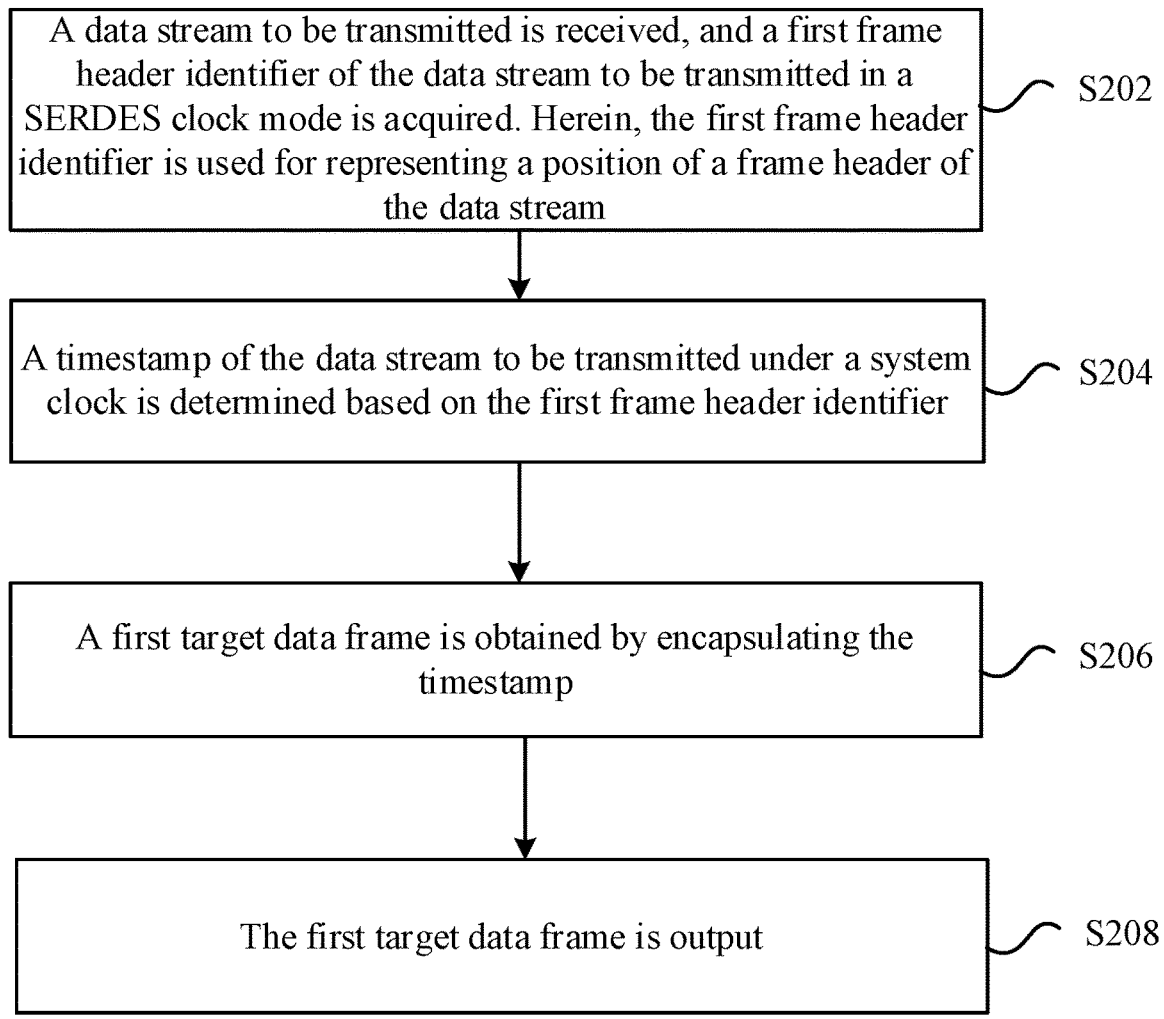
FIG. 2 is a flowchart for a method for acquiring a timestamp of a data stream according to an embodiment of the present disclosure.

FIG. 2 is a flowchart for a method for acquiring a timestamp of a data stream according to an embodiment of the present disclosure. As shown in FIG. 2, the flow includes the following steps.

In step 202, the data stream to be transmitted is received, and a first frame header identifier of the data stream to be transmitted in a SERDES clock mode is acquired. Herein, the first frame header identifier represents a position of a frame header of the data stream.

The first frame header identifier may be an alignment marker (AM) frame header identifier, or an AM identifier for short. The AM identifier may be an identifier generated by an additional AM detection module in the SERDES clock mode. The AM detection module is disposed within the chip. After the chip receives the data stream to be transmitted, firstly, a bit corresponding to the AM identifier generated by the AM detection module may be converted to a bit corresponding to the data stream to be transmitted under the SERDES clock mode. For example, the above AM identifier includes 4 bits, while the data stream to be transmitted includes 3 bits. Then, the chip combines the 3-bit data stream to be transmitted into a 6-bit data stream to be transmitted. Next, the chip represents the position of the frame header of the data stream to be transmitted with a header position of the AM identifier.

In step 204, the timestamp of the data stream to be transmitted under a system clock is determined based on the first frame header identifier.

Determining the timestamp of the data stream to be transmitted under the system clock based on the first frame header identifier refers to: converting the AM identifier under the SERDES clock mode to an AM identifier under a system clock mode. The system clock may include a system rising edge clock and a system falling edge clock. In this embodiment, the AM identifier may be synchronized using the system rising edge clock when the system rising edge clock is valid, so as to obtain a timestamp T1 corresponding to the system rising edge clock. Furthermore, the AM identifier may be synchronized using the system falling edge clock when the system falling edge clock is valid, so as to obtain a timestamp T2 corresponding to the system falling edge clock. Then, a timestamp T0 of the data stream to be transmitted under the system clock is determined based on comparison between T1 and T2.

In step 206, a first target data frame is obtained by encapsulating the timestamp.

After the timestamp of the data stream to be transmitted under the system clock is determined in step S204, the determined timestamp under the system clock is encapsulated in a preset frame format. Herein, the preset frame format may include a check value for representing correctness or error of the timestamp under the system clock.

In step S208, the first target data frame is output.

In the step S202, the data stream to be transmitted may be received in sequence in a 1-bit manner. As a result, the first target data frame may be output in the 1-bit manner. Finally, after the first target data frame is output completely, the timestamp concerning the data stream to be transmitted may be obtained.

In the method for acquiring a timestamp of a data stream provided in this embodiment, Firstly, the data stream to be transmitted is received, and a first frame header identifier of the data stream to be transmitted in a SERDES clock mode is acquired. Herein, the first frame header identifier represents a position of a frame header of the data stream. Secondly, the timestamp of the data stream to be transmitted under a system clock is determined based on the first frame header identifier. Thirdly, a first target data frame is obtained by encapsulating the timestamp. And finally, the first target data frame is output. That is to say, in this embodiment, in the SERDES clock mode, i.e. in a data clock mode, after the first frame header identifier representing the position of the frame header of the data stream is acquired, a series of processing including conversion in a system clock domain of the first frame header identifier, encapsulating and output is performed to obtain a precise timestamp of the data stream to be transmitted, rather than converting the data stream to be transmitted under a data clock domain mode to the data stream to be transmitted under the system clock domain. Therefore, a data gap resulting from the clock conversion on the data stream to be transmitted is avoided, thus a case in which no accurate timestamp can be obtained by sampling of timestamp on a converted data stream to be transmitted (i.e., a data stream including invalid data) is avoided. In this way, the problem that no precise timestamp of a data stream can be acquired is addressed, and the objective of precisely acquiring the timestamp of the data stream is achieved.

In another example, the step S202 of receiving a data stream to be transmitted and acquiring a first frame header identifier of the data stream to be transmitted in the SERDES clock mode may include the following steps.

In step S202-11, the data stream to be transmitted is received and the data stream to be transmitted is demultiplexed in the SERDES clock mode to obtain data of N logic lanes, N being an integer.

Herein, N being 4 is taken as an example to describe the demultiplexing of the data stream to be transmitted. Data of 4 logic lanes in FLEXO may be obtained by performing bit demultiplexing on two pairs of 56G SERDES at a high speed in the SERDES clock mode. For example, the data of 4 logic lanes in FLEXO includes data of logic lane for lane 0, data of logic lane for lane 1, data of logic lane for lane 2 and data of logic lane for lane 3.

In step S202-12, a position of a frame header of data of each logic lane is acquired in response to the position of the frame header of data of each logic lane being determined, and a second frame header identifier of data of each logic lane is obtained.

A searching of the header position of the AM identifier is performed on the four lanes by bit, respectively. For example, for the data of logic lane for lane 0, it is assumed that the data of logic lane for lane 0 include a data block a, a data block b and a data block c each having an AM identifier. During the searching, it is supposed that the data block a, the data block b and the data block c each having the AM identifier emerge again per 10 bytes, then the chip determines that the position of the frame header of the data of logic lane for lane 0 is at the end of the tenth byte, and this position corresponds to a second frame header identifier AM0 of the data of logic lane for lane 0. Similarly, searching may be performed on the other three lanes in a manner described above and the chip may determine a position of a corresponding frame header, i.e., a second frame header identifier of data of logic lane for each lane. Herein, the second frame header identifiers of the other three lanes AM1, AM2 and AM3 can be obtained in the above-mentioned manner, respectively.

In step S202-13, the first frame header identifier is determined based on the second frame header identifier of data of each logic lane.

Determining the first frame header identifier based on the second frame header identifier of data of each logic lane may refers to selecting one of AM0, AM1, AM2 and AM3 as the first frame header identifier AM.

The step S202-13 may include: selecting, from the data of N logic lanes, data of one lane as data of a designated lane; calculating a plurality of offsets of second frame header identifiers of data of the other N−1 logic lanes relative to a second frame header identifier of data of the designated logic lane; acquiring a largest offset of the plurality of offsets, and determining a second frame header identifier corresponding to the largest offset as the first frame header identifier.

The plurality of offsets of the second frame header identifiers of the data of the N−1 logic lanes relative to the second frame header identifier of data of a first logic lane may be calculated on the basis of the second frame header identifier AM0 of the data of logic lane for lane 0. For example, offsets of the AM1 for the lane 1, of the AM2 for the lane 2 and of the AM3 for the lane 3 relative to the AM0 for the lane 0 may be respectively calculated to obtain a first offset P1, a second offset P2 and a third offset P3. A second frame header identifier corresponding to a largest offset of the data of the logic lane, i.e., the data of the logic lane arriving latest, is selected as the first frame header identifier AM. Herein, it is supposed that a relationship among the first offset P1, the second offset P2 and the third offset P3 is: the first offset P1<the second offset P2<the third offset P3. That is to say, the third offset P3 is the largest, i.e., the second frame header identifier of the lane 3 arrives latest. As a result, the chip selects the AM3 corresponding to the third offset P3 as the first frame header identifier AM.

In another example, the step 204 of determining the timestamp of the data stream to be transmitted under a system clock based on the first frame header identifier may include a step S204-1. In step S204-1, a rising edge and a falling edge of the system clock are synchronized with the first frame header identifier to obtain the timestamp of the data stream to be transmitted under the system clock.

The system clock may include the system rising edge clock and the system falling edge clock. When performing conversion in clock domain on the first frame header identifier, the conversion is performed based on the system rising edge clock and the system falling edge clock respectively. Then a smaller value of results of the conversion is selected as the timestamp of the data stream to be transmitted under the system clock.

The step S204-1 may be performed via the following steps.

In step S204-11, the rising edge of the system clock is synchronized with the first frame header identifier to obtain a third frame header identifier of the data stream to be transmitted under the system clock.

Figure 3:
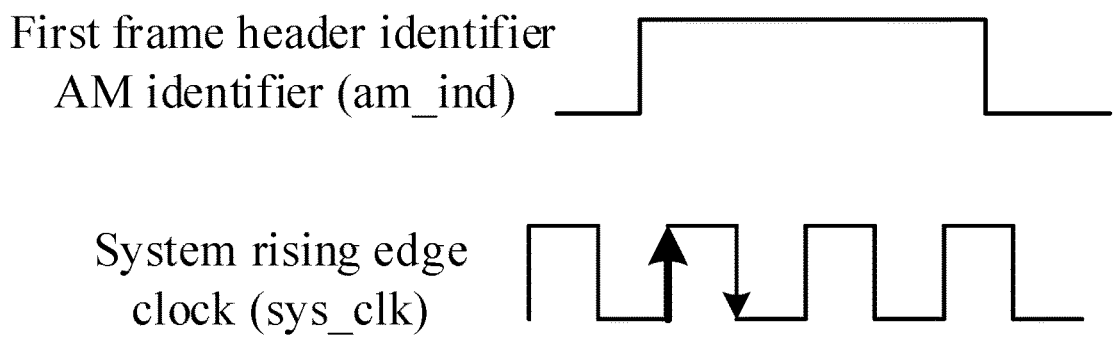
FIG. 3 is a schematic diagram for synchronizing a rising edge of a system clock with a first frame header identifier according to an embodiment of the present disclosure.

With reference to FIG. 3, am_ind in FIG. 3 refers to a schematic diagram of a pulse corresponding to the first frame header identifier, i.e. AM identifier, and sys_clk refers to a schematic diagram of a pulse corresponding to the system rising edge clock. When the system rising edge clock is valid, i.e., the rising edge arrives first, which is marked with a bold arrow in FIG. 3. The system rising edge clock is used to synchronize with the pulse corresponding to the first frame header identifier, i.e. AM identifier to obtain the third frame header identifier, i.e., the timestamp T1 corresponding to the system rising edge clock.

In step S204-12, the falling edge of the system clock is synchronized with the first frame header identifier to obtain a fourth frame header identifier of the data stream to be transmitted under the system clock.

The am_ind in FIG. 4 refers to a schematic diagram of a pulse corresponding to the first frame header identifier, i.e. AM identifier, and the am_ind in FIG. 4 refers to a same pulse as am_ind in FIG. 3 does, and sys_clk refers to a schematic diagram of a pulse corresponding to the system falling edge clock. When the system falling edge clock is valid, i.e., the falling edge arrives first, which is marked with a bold arrow in FIG. 4. The system falling edge clock is used to synchronize with the pulse corresponding to the first frame header identifier, i.e. AM identifier to obtain the fourth frame header identifier, i.e., the timestamp T2 corresponding to the system falling edge clock.

In step S204-13, the timestamp of the data stream to be transmitted under the system clock is acquired based on the third frame header identifier and the fourth frame header identifier.

Based on a comparison of T1 with T2, the timestamp T0 of the data stream to be transmitted under the system clock may be determined.

The step S204-13 may include: comparing the third frame header identifier with the fourth frame header identifier; acquiring a smaller frame header identifier of the third frame header identifier and the fourth frame header identifier, and determining the smaller frame header identifier as the timestamp of the data stream to be transmitted under the system clock.

It is supposed that T1 is smaller than T2, then T1 is selected as the timestamp T0 of the data stream to be transmitted under the system clock.

In another example, the step S206 of encapsulating the timestamp to obtain the first target data frame includes the following steps.

In step S206-11, a cyclic redundancy check (CRC) is generated.

A CRC value may be used as a check value for representing correctness or error of the timestamp under the system clock. In practice, when the data stream to be transmitted is received, the chip acquires a first timestamp of the data stream to be transmitted and a first CRC value corresponding to the first timestamp. The chip transmits the first timestamp and the first CRC value to a receiving end. The receiving end acquires the first timestamp and the first CRC value and calculates a second CRC value according to the first timestamp. The receiving end determines whether the first CRC value is the same as the second CRC value. If yes, the acquired timestamp is correct; if no, the acquired timestamp is erroneous.

In step S206-12, the timestamp and the CRC are encapsulated based on the preset frame format to obtain the first target data frame.

A format of the first target data frame may be similar to a format of a time of day (TOD) frame. Therefore, the first target data frame also may be called a quasi-TOD frame. For example, in this embodiment with reference to FIG. 5, in the first target data frame, a start bit always occupies 1 bit and with a value of 0, two-words synchronization header for a frame header are 0x43 and 0x4d, respectively, the CRC occupies 1 bit (with a value of 0 or 1), and a stop bit always occupies 1 bit and with a value of 1.

In another example, the step S208 of outputting the first target data frame may include the following steps: broadening a pulse width of the first target data frame to obtain a second target data frame; and outputting the second target data frame.

An output order of an entire first target data frame may be: the start bit, the synchronization header, a second portion of a timestamp, a nanosecond portion of the timestamp and a CRC stop bit. In addition, the first target data frame may be transmitted in a manner of little-endian transmission. Accordingly, the method for acquiring a timestamp of a data stream provided in this embodiment may achieve a synchronization precision at a nanosecond level.

Alternatively, since a system clock used by the chip has a higher frequency than an off-chip FPGA clock does, a transmitted timestamp has to be broadened. That is, the pulse width of the first target data frame is broadened to obtain the second target data frame, and the second target data frame is output, so as to ensure that the off-chip FPGA can sample each bit and can correctly recover the timestamp. In this embodiment, the broadening may be performed proportionally according to a multiple relationship between a clock of a transmitting end and a clock of a receiving end, and to configuration of a central processing unit (CPU). In this way, an off-chip FPGA may perform multiple times of sampling on each piece of 1-bit timestamp information, and may correctly recover a 64-bit timestamp through a majority judgment method.

Alternatively, in a transmission direction, after the off-chip FPGA acquires a timestamp of the chip, an abbreviated message of a precision time protocol (PTP) may be inserted into a next FLEXO frame. In a reception direction, a timestamp stamped by an AM identifier in each frame is recorded, and the timestamp corresponding to a header of a PTP packet is selected based on the PTP packet obtained through analysis. In this way, timestamps in the transmission direction and the reception direction can be matched, and thus the 1588 function can be achieved.

It is known from the above that the method for acquiring a timestamp of a data stream provided in this embodiment can generate a high-precision timestamp through the FLEXO AM identifier, thus can achieve the 1588 function. Comparing with a conventional time-stamping manner, this method satisfies the IEEE1588V2 protocol, and achieves stamping a timestamp with a frame header for frame synchronization in a SERDES clock domain. In this way, jitters of the timestamp can be significantly reduced and a timestamp of higher precision can be acquired.

Based on the description on the embodiments of the present disclosure, the method according to the above embodiments may be implemented through software in addition to indispensable general hardware platform, or through hardware only. The technical solutions of the present disclosure may substantively be embodied in a manner of software product. The computer software product is stored in a storage medium (such as a read-only memory (ROM)/random access memory (RAM), a magnetic disc and an optical disc) and includes a plurality of instructions to enable a terminal device (which may be a mobile phone, a computer, a server, a network device or the like) to perform the method according to the embodiments of the present disclosure.

Embodiment 2

This embodiment provides an apparatus for acquiring a timestamp of a data stream. The apparatus is configured to implement the above embodiments and those have been described will not be repeated. As presented in the following text, term "module" refers to a combination of software and/or hardware that may implement predetermined functions. Although the apparatus described in this embodiment is implemented through software, it is possible and conceivable that the apparatus may be implemented through hardware or a combination of software and hardware.

FIG. 6 is a schematic diagram for a structure of an apparatus for acquiring a timestamp of a data stream according to an embodiment of the present disclosure. As shown in FIG. 6, the apparatus includes:

a receiving module 62 configured to receive a data stream to be transmitted and acquire a first frame header identifier of the data stream to be transmitted in a SERDES clock mode, the first frame header identifier being used for representing a position of a frame header of the data stream to be transmitted; a determining module 64 configured to determine, based on the first frame header identifier, a timestamp of the data stream to be transmitted under a system clock; an encapsulating module 66 configured to encapsulate the timestamp to obtain a first target data frame; and an outputting module 68 configured to output the first target data frame.

Alternatively, the receiving module 62 may include: a receiving unit configured to receive the data stream to be transmitted, and demultiplex the data stream to be transmitted in the SERDES clock mode to obtain data of N logic lanes, N being an integer; a first acquiring unit configured to acquire a position of a frame header of data of each logic lane when the position of the frame header of the data of each logic lane is determined to obtain a second frame header identifier of the data of each logic lane; and a determining unit configured to determine the first frame header identifier based on the second frame header identifier of the data of each logic lane.

The determining unit may include: a selecting sub-unit configured to select, from the data of the N logic lanes, data of one lane as data of a designated lane; a calculating sub-unit configured to calculate a plurality of offsets of second frame header identifiers of data of other N−1 logic lanes relative to a second frame header identifier of the data of the designated logic lane; and an acquiring sub-unit configured to acquire a largest offset of the plurality of offsets, and determine a second frame header identifier corresponding to the largest offset as the first frame header identifier.

Alternatively, the determining module 64 is configured to synchronize the rising edge and the falling edge of the system clock with the first frame header identifier to obtain the timestamp.

Alternatively, the determining module 64 may include: a first synchronization unit configured to synchronize the rising edge of the system clock with the first frame header identifier to obtain a third frame header identifier of the data stream to be transmitted under the system clock; a second synchronization unit configured to synchronize the falling edge of the system clock with the first frame header identifier to obtain a fourth frame header identifier of the data stream to be transmitted under the system clock; and a second acquiring unit configured to acquire the timestamp based on the third frame header identifier and the fourth frame header identifier.

The second acquiring unit may include: a comparison sub-unit configured to compare the third frame header identifier with the fourth frame header identifier; and a determining sub-unit configured to determine a smaller frame header identifier of the third frame header identifier and the fourth frame header identifier based on a comparison result, and to take the smaller frame header identifier as the timestamp.

Alternatively, the encapsulating module 66 may include: a generation unit configured to generate a CRC; and an encapsulating unit configured to encapsulate the timestamp and the CRC based on a preset frame format to obtain the first target data frame.

Alternatively, the outputting module 68 may include: a broadening unit configured to broaden a pulse width of the first target data frame to obtain a second target data frame; and an outputting unit configured to output the second target data frame.

The above multiple modules may be implemented through software or hardware. For the case of hardware, the modules may be implemented in but not limited to the following manner: the above modules are all disposed in a same processor; alternatively, the above multiple modules are disposed in different processors in random combination of the multiple modules.

Embodiment 3

In this embodiment, a storage medium is further provided. The storage medium stores a computer program configured to perform the steps in any one of the above method embodiments when the computer program is running.

Alternatively, in this embodiment, the storage medium is configured to store a computer program for performing the following steps:

S1: receiving a data stream to be transmitted, and acquiring a first frame header identifier of the data stream to be transmitted in a serializer-deserializer (SERDES) clock mode, where the first frame header identifier represents a position of a frame header of the data stream to be transmitted;

S2: determining, based on the first frame header identifier, a timestamp of the data stream to be transmitted under a system clock;

S3: encapsulating the timestamp to obtain a first target data frame; and

S4: outputting the first target data frame.

Alternatively, in this embodiment, the storage medium may include but not limited to multiple types of media capable of storing computer programs, such as a USB flash drive, a ROM, a RAM, a mobile hard disc, a magnetic disc or an optical disc.

This embodiment further provides an electronic apparatus including a memory and a processor. The memory stores a computer program, and the processor is configured to run the computer program to perform steps in any one of the above method embodiments.

Alternatively, the electronic apparatus may further include a transmission device and an input/output device. Herein, the transmission device is connected to the above processor, and the input/output device is connected to the above processor.

Alternatively, in this embodiment, the processor may be configured to implement the following steps through the computer program:

S1: receiving a data stream to be transmitted, and acquiring a first frame header identifier of the data stream to be transmitted in a SERDES clock mode, where the first frame header identifier represents a position of a frame header of the data stream to be transmitted;

S2: determining, based on the first frame header identifier, a timestamp of the data stream to be transmitted under a system clock;

S3: encapsulating the timestamp to obtain a first target data frame; and

S4: outputting the first target data frame.

Alternatively, specific examples in this embodiment may be provided with reference to the examples described in the above embodiments and alternatives and will not be repeated here.

The modules or steps of the present disclosure can be implemented by a general computing device. The modules or steps can be grouped in a single computing apparatus or may be distributed in a network composed of multiple computing apparatuses. Alternatively, the modules or steps can be implemented with program codes executable by a computing apparatus, so that they can be stored in a storage device for execution of the computing device. In some cases, the steps shown or described can be performed in a different order from that herein, or the modules or steps can be respectively made into multiple integrated circuit modules, or multiple modules or steps of them can be made into a single integrated circuit module. In this way, the present disclosure is not limited to any particular combination of hardware and software.

What is claimed is:

1. A method for acquiring a timestamp of a data stream, comprising:
   receiving a data stream to be transmitted, and acquiring a first frame header identifier of the data stream to be transmitted in a serializer-deserializer (SERDES) clock mode, wherein the first frame header identifier represents a position of a frame header of the data stream to be transmitted;
   determining, based on the first frame header identifier, a timestamp of the data stream to be transmitted under a system clock;
   encapsulating the timestamp to obtain a first target data frame; and
   outputting the first target data frame;
   wherein receiving the data stream to be transmitted and acquiring the first frame header identifier of the data stream to be transmitted in the SERDES clock mode comprise:
   receiving the data stream to be transmitted, and demultiplexing the data stream to be transmitted in the SERDES clock mode, to obtain data of N logic lanes, wherein N is an integer;
   acquiring a position of a frame header of data of each logic lane when the position of the frame header of the data of each logic lane is determined to obtain a second frame header identifier of the data of each logic lane; and
   determining the first frame header identifier based on the second frame header identifier of the data of each logic lane.

2. The method according to claim 1, wherein determining the first frame header identifier based on the second frame header identifier of the data of each logic lane comprises:
   selecting, from the data of the N logic lanes, data of one logic lane as data of a designated logic lane;
   calculating a plurality of offsets of second frame header identifiers of data of N−1 logic lanes except the data of the designated logic lane among the data of the N logic lanes relative to a second frame header identifier of the data of the designated logic lane; and
   acquiring a largest offset of the plurality of offsets, and determining a second frame header identifier corresponding to the largest offset as the first frame header identifier.

3. The method according to claim 1, wherein determining, based on the first frame header identifier, the timestamp of the data stream to be transmitted under the system clock comprises:
   synchronizing a rising edge and a falling edge of the system clock with the first frame header identifier to obtain the timestamp of the data stream to be transmitted under the system clock.

4. The method according to claim 3, wherein synchronizing the rising edge and the falling edge of the system clock with the first frame header identifier to obtain the timestamp of the data stream to be transmitted under the system clock comprises:
   synchronizing the rising edge of the system clock with the first frame header identifier to obtain a third frame header identifier of the data stream to be transmitted under the system clock;
   synchronizing the falling edge of the system clock with the first frame header identifier to obtain a fourth frame header identifier of the data stream to be transmitted under the system clock; and
   acquiring the timestamp based on the third frame header identifier and the fourth frame header identifier.

5. The method according to claim 4, wherein acquiring the timestamp based on the third frame header identifier and the fourth frame header identifier comprises:
   comparing the third frame header identifier with the fourth frame header identifier; and
   determining a smaller frame header identifier of the third frame header identifier and the fourth frame header identifier based on a comparison result, and taking the smaller frame header identifier as the timestamp.

6. The method according to claim 1, wherein encapsulating the timestamp to obtain the first target data frame comprises:
   generating a cyclic redundancy check (CRC); and
   encapsulating the timestamp and the CRC based on a preset frame format to obtain the first target data frame.

7. The method according to claim 1, wherein outputting the first target data frame comprises:
   broadening a pulse width of the first target data frame to obtain a second target data frame; and
   outputting the second target data frame.

8. A non-transitory computer readable storage medium, storing a computer program configured to cause a processor to perform a method for acquiring a timestamp of a data stream when the computer program is running on the processor, the method comprising:
   receiving a data stream to be transmitted, and acquiring a first frame header identifier of the data stream to be transmitted in a serializer-deserializer (SERDES) clock mode, wherein the first frame header identifier represents a position of a frame header of the data stream to be transmitted;
   determining, based on the first frame header identifier, a timestamp of the data stream to be transmitted under a system clock;
   encapsulating the timestamp to obtain a first target data frame; and
   outputting the first target data frame;
   wherein receiving the data stream to be transmitted and acquiring the first frame header identifier of the data stream to be transmitted in the SERDES clock mode comprises:

receiving the data stream to be transmitted, and demultiplexing the data stream to be transmitted in the SERDES clock mode, to obtain data of N logic lanes, wherein N is an integer;

acquiring a position of a frame header of data of each logic lane when the position of the frame header of the data of each logic lane is determined to obtain a second frame header identifier of the data of each logic lane; and determining the first frame header identifier based on the second frame header identifier of the data of each logic lane.

9. The non-transitory computer readable storage medium according to claim 8, wherein determining the first frame header identifier based on the second frame header identifier of the data of each logic lane comprises:

selecting, from the data of the N logic lanes, data of one logic lane as data of a designated logic lane;

calculating a plurality of offsets of second frame header identifiers of data of N−1 logic lanes except the data of the designated logic lane among the data of the N logic lanes relative to a second frame header identifier of the data of the designated logic lane; and acquiring a largest offset of the plurality of offsets, and determining a second frame header identifier corresponding to the largest offset as the first frame header identifier.

10. The non-transitory computer readable storage medium according to claim 8, wherein determining, based on the first frame header identifier, the timestamp of the data stream to be transmitted under the system clock comprises:

synchronizing a rising edge of the system clock with the first frame header identifier to obtain a third frame header identifier of the data stream to be transmitted under the system clock;

synchronizing a falling edge of the system clock with the first frame header identifier to obtain a fourth frame header identifier of the data stream to be transmitted under the system clock;

comparing the third frame header identifier with the fourth frame header identifier; and determining a smaller frame header identifier of the third frame header identifier and the fourth frame header identifier based on a comparison result, and taking the smaller frame header identifier as the timestamp.

11. The non-transitory computer readable storage medium according to claim 8, wherein encapsulating the timestamp to obtain the first target data frame comprises:

generating a cyclic redundancy check (CRC);

encapsulating the timestamp and the CRC based on a preset frame format to obtain the first target data frame.

12. The non-transitory computer readable storage medium according to claim 8, wherein outputting the first target data frame comprises:

broadening a pulse width of the first target data frame to obtain a second target data frame; and outputting the second target data frame.

13. An electronic apparatus, comprising a memory and a processor, wherein the memory stores a computer program, and the processor is configured to run the computer program to perform a method for acquiring a timestamp of a data stream, comprising:

receiving a data stream to be transmitted, and acquiring a first frame header identifier of the data stream to be transmitted in a serializer-deserializer (SERDES) clock mode, wherein the first frame header identifier represents a position of a frame header of the data stream to be transmitted;

determining, based on the first frame header identifier, a timestamp of the data stream to be transmitted under a system clock;

encapsulating the timestamp to obtain a first target data frame; and outputting the first target data frame;

wherein receiving the data stream to be transmitted and acquiring the first frame header identifier of the data stream to be transmitted in the SERDES clock mode comprise:

receiving the data stream to be transmitted, and demultiplexing the data stream to be transmitted in the SERDES clock mode, to obtain data of N logic lanes, wherein N is an integer;

acquiring a position of a frame header of data of each logic lane when the position of the frame header of the data of each logic lane is determined to obtain a second frame header identifier of the data of each logic lane; and determining the first frame header identifier based on the second frame header identifier of the data of each logic lane.

14. The electronic apparatus according to claim 13, wherein determining the first frame header identifier based on the second frame header identifier of the data of each logic lane comprises:

selecting, from the data of the N logic lanes, data of one logic lane as data of a designated logic lane;

calculating a plurality of offsets of second frame header identifiers of data of N−1 logic lanes except the data of the designated logic lane among the data of the N logic lanes relative to a second frame header identifier of the data of the designated logic lane; and acquiring a largest offset of the plurality of offsets, and determining a second frame header identifier corresponding to the largest offset as the first frame header identifier.

15. The electronic apparatus according to claim 13, wherein determining, based on the first frame header identifier, the timestamp of the data stream to be transmitted under the system clock comprises:

synchronizing a rising edge of the system clock with the first frame header identifier to obtain a third frame header identifier of the data stream to be transmitted under the system clock;

synchronizing a falling edge of the system clock with the first frame header identifier to obtain a fourth frame header identifier of the data stream to be transmitted under the system clock;

comparing the third frame header identifier with the fourth frame header identifier; and determining a smaller frame header identifier of the third frame header identifier and the fourth frame header identifier based on a comparison result, and taking the smaller frame header identifier as the timestamp.

16. The electronic apparatus according to claim 13, wherein encapsulating the timestamp to obtain the first target data frame comprises:

generating a cyclic redundancy check (CRC); and encapsulating the timestamp and the CRC based on a preset frame format to obtain the first target data frame.

17. The electronic apparatus according to claim 13, wherein outputting the first target data frame comprises:

broadening a pulse width of the first target data frame to obtain a second target data frame; and
outputting the second target data frame.

\* \* \* \* \*